(12) United States Patent
Cramer et al.

(10) Patent No.: US 6,230,378 B1
(45) Date of Patent: May 15, 2001

(54) PROCESS FOR MANUFACTURING MONOLITHIC MULTILAYER PIEZOELECTRIC ACTUATOR

(75) Inventors: Dieter Cramer, Holzkirchen; Hans Hellebrand, München; Karl Lubitz, Ottobrunn, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/155,471

(22) PCT Filed: Mar. 10, 1997

(86) PCT No.: PCT/DE97/00463

§ 371 Date: Sep. 29, 1998

§ 102(e) Date: Sep. 29, 1998

(87) PCT Pub. No.: WO97/40537

PCT Pub. Date: Oct. 30, 1997

(30) Foreign Application Priority Data

Apr. 19, 1996 (DE) ............................................. 196 15 695

(51) Int. Cl.[7] .................................................... H04R 17/00
(52) U.S. Cl. .................... 29/25.35; 310/800; 361/321.5; 427/100; 501/136
(58) Field of Search .......................... 29/25.35; 427/100; 361/321.5; 264/615; 501/136; 310/800

(56) References Cited

U.S. PATENT DOCUMENTS 5,164,882 * 11/1992 Kanai et al. ...................... 361/321.5
5,438,232   8/1995 Inoue et al. .

FOREIGN PATENT DOCUMENTS

WO 92/17420   10/1992 (WO) .

OTHER PUBLICATIONS

Patent Abstract of Japan, vol. 12, No. 285, (E–642), Aug. 4, 1988 & JP 63–062280 dated Mar. 18, 1988.

Patent Abstract of Japan, vol. 014, No. 018, (E–873), Jan. 16, 1990 & JP 01–260870 dated Oct. 18, 1989.

Sensors and Actuators A, 43 (1994), H. Moilanen et al, "Development of piezoelectric micromovement actuator fabrication using a thick–film double–paste printing method", pp. 357–365.

Ferro–electrics, vol. 90, (1983), S. Takahashi et al, Internal Electrode Piezoelectric Ceramic Actuation, pp. 181–190.

* cited by examiner

Primary Examiner—I Cuda Rosenbaum
Assistant Examiner—Rick Kiltae Chang
(74) Attorney, Agent, or Firm—Schiff Hardin & Waite

(57) ABSTRACT

A monolithic piezoelectric actuator is made of a stoichiometric PZT ceramic (2) with low A-site doping, and electrode layers (1) containing silver and palladium. It exhibits an improved mechanical strength with good piezoelectric properties. The production process leads to optimum grain sizes and optimum piezoelectric properties irrespective of any B-site doping in the ceramic. Multilayer piezoelectric actuators with high application temperatures up to 150° C. can be obtained.

5 Claims, 1 Drawing Sheet

MASS PART OF SILVER IN %

PROCESS FOR MANUFACTURING MONOLITHIC MULTILAYER PIEZOELECTRIC ACTUATOR

BACKGROUND OF THE INVENTION

Piezoelectric actuators normally comprise a plurality of piezoelectric elements arranged in a stack. Each of these elements in turn comprises a piezoceramic layer which is provided on both sides with metallic electrodes. If a voltage is applied to these electrodes, then the piezoceramic layer reacts with a lattice distortion which leads to a usable lengthwise expansion along a major axis. Since this in turn amounts to less than two parts per thousand of the layer thickness along the major axis, a correspondingly higher layer thickness of active piezoceramic must be provided in order to achieve a desired absolute lengthwise expansion. With increasing layer thickness of the piezoceramic layer within one piezoelectric element, however, the voltage necessary for the response of the piezoelectric element also rises. In order to keep this within manageable limits, the thicknesses of individual piezoelectric elements in multilayer actuators normally lie between 20 and 200 $\mu$m. A piezoelectric actuator must therefore have an appropriate number of individual elements or layers for a desired lengthwise expansion.

Known piezoelectric actuators of multilayer design therefore comprise up to several hundred individual layers. These can be arranged to form a stack and, for example, can be adhesively bonded. U.S. Pat. No. 5,438,232 discloses a process for the production of multilayer actuators by bonding individual actuators with the aid of a resin. However, such a bonded stack exhibits too low a stiffness for many applications, in particular when high forces have to be transmitted using the piezoelectric actuator. Sufficiently high stiffnesses are possessed by piezoelectric actuators of monolithic multilayer design. In order to produce them, piezoceramic green films are arranged alternately with electrode material to form a stack and are sintered together. Only in this way is it to achieve a sufficiently solid composite of the individual layers in the stack. An article by H. Moilanen et al. in the journal Sensors and Actuators A, 43 (1994) 357 to 365 discloses a process for the production of a multilayer piezoelectric actuator in which both the ceramic layers and the electrode layers are produced by alternating overprinting. In this case, drying or presintering at temperatures up to 750° C. is necessary at regular intervals.

An article by S. Takahashi et al. in Ferroelectrics, 1983, Vol. 90, pages 181 to 190, discloses a process for the production of a multilayer actuator which is obtained by stacking ceramic green films printed with electrode layers on one another and laminating them, and subsequent sintering of the-stack.

In the production of monolithic multilayer piezoelectric actuators, the material properties both of the piezoceramic and of the electrode material must be taken into account during the setting of the process conditions, in particular during the sintering process. Problems are posed, for example, by the optimum sintering temperature for piezoceramic, which, in order to achieve optimum grain sizes and hence optimum piezoelectric properties as a function of the composition of the piezoceramic, may lie above 1250° C. At such a high sintering temperature, only platinum can be used as the electrode material. This exhibits a weak interaction with the ceramic and can be used together with most piezoceramic materials. However, the high material costs for platinum are disadvantageous, as is the limited strength at the interface between electrode and piezoceramic.

If Ag/Pd, which is cost-effective and common in multilayer capacitors, is used as the electrode material, then the sintering temperature is limited by the melting point of the alloy, which may, for example, lie below 1130° C. (in the case of Ag/Pd 70/30). Hence, one is limited to piezoceramic materials whose optimum sintering temperature lies at most at the melting point of the alloy. To lower the optimum sintering temperature, such piezoceramics contain B-site dopings of typically 20 to 50 percent in relation to the lead zirconium titanate (PZT) basic material. As a disadvantage, in the case of these ceramics a lowered Curie temperature must be tolerated, which limits the maximum application temperature of the piezoelectric actuator. In addition, in the case of this material combination there has also been shown to be a limited strength in the stack at the piezoceramic/electrode interface.

SUMMARY OF THE INVENTION

It is therefore the object of the present invention to specify a production process for a piezoelectric actuator of monolithic multilayer design which is not limited to piezoceramic material of low Curie and application temperature, which nevertheless has good piezoelectric properties and which additionally possesses a high mechanical composite strength.

According to the invention, this object is achieved with a process in accordance with claim 1. Special refinements of the invention emerge from further claims.

In general terms the present invention is a process for producing a piezoelectric actuator of monolithic multilayer design. To produce piezoceramic green films, the starting point is a stoichiometric piezoceramic powder of the PZT type, to which are added a stoichiometric excess of a heterovalent rare earth metal up to an overall content of 1 to 5 mol % and a stoichiometric excess of an additional 1–5 mol % of lead oxide. Electrode layers of a paste containing silver and palladium are applied to the green films. The green films are stacked on one another and then laminated such that an alternating sequence results of green films and electrode layers in the stack. The laminated stack is sintered under controlled sintering conditions such that excess lead oxide evaporates off and the hyperstoichiometric rare earth doping is compensated by inward diffusion of silver from the electrode layers. The sintering is carried out at a maximum temperature of 1130° C. in an oxidizing atmosphere. During the sintering, a holding phase of 30 to 120 minutes at the maximum temperature is maintained. Stoichiometric piezoceramic layers with homogeneous silver doping are thereby obtained.

Advantageous developments of the present invention are as follows.

For a desired thickness of the electrode layers of 2–4 $\mu$m (following sintering), at the time of applying the electrode layers a higher layer thickness is selected as a layer thickness allowance which compensates the subsequent layer thickness loss by the inward diffusion of silver into the piezoceramic layer. The layer thickness allowance is determined in proportion to the layer thickness ratio of piezoceramic layer to electrode and to the dopant content of the rare earth metal.

As the rare earth metal, La or Nd in stoichiometric excess is added to the piezoceramic powder.

A piezoceramic powder is used which has complex B-site doping.

With the invention, for the first time a piezoelectric actuator is produced which has optimum grain sizes in the piezoceramic layers, irrespective of any doping which may be present on a B site with an electrode layer containing silver/palladium. The piezoelectric actuators possess the optimum values which are known and expected from a piezoceramic layer of identical composition which is sintered under optimum conditions and separately from the electrode layer. In this case, the piezoelectric actuator has a monolithic design in which piezoceramic green films and electrode layers have been sintered together and therefore have a high strength in the connection between electrode layer and ceramic layer. The electrode layer, which consists, for example, of a silver/palladium alloy, remains undamaged during the sintering process, since the latter can be carried out below the melting temperature of the electrode material. It is particularly surprising that in this way it is also possible to obtain a piezoelectric actuator which combines a low or entirely absent B-site doping, cost-effective silver/palladium electrode layers, high grain sizes and good piezoelectric properties of the piezoceramic layers with simultaneous high composite strength of the individual layers in the stack. In this way it is possible to obtain, in particular, even piezoelectric actuators which possess a high Curie temperature which enables use of the piezoelectric actuator at relatively high operating temperatures. This was previously not known, since piezoceramics with high Curie temperatures require higher sintering temperatures than were previously possible with the low melting point of the electrode layers used. Non-optimum sintering conditions at too low a sintering temperature hamper the grain growth, however, and yield piezoceramics with poor piezoelectric properties. Good piezoelectric properties, on the other hand, are obtained if, as in the case of the piezoelectric actuator according to the invention, the grain sizes of the piezoceramic layers lie in the same range from 2 to 10 $\mu$m as is achieved in the case of sintering the ceramic on its own, that is to say without electrodes, using a higher optimum sintering temperature.

For the production of the piezoelectric actuator, likewise according to the invention, a starting point is a known process for the production of monolithic multilayer components, in which piezoceramic green films provided with electrode material are alternately stacked on one another and are then sintered together. According to the invention, the starting point is a piezoceramic powder of the lead zirconate titanate (PZT) type, which has a stoichiometric composition. In addition to this stoichiometric composition, a small proportion of a heterovalent A-site dopant at the level of 1 to 5 mol percent as well as a further excess of an additional 1 to 5 mol percent lead oxide are added. In addition, an electrode material containing silver and palladium is used. The stack is then laminated and sintered under controlled conditions in an oxidizing atmosphere, the sintering temperature being allowed to reach at most the melting point of the electrode material containing silver and palladium. The sintering is carried out such that stoichiometrically excess lead oxide evaporates off and that, in addition, silver diffuses out of the electrode layers into the piezoceramic layers, a stoichiometric piezoceramic composition being obtained.

The invention is based on the surprising knowledge that a hyperstoichiometric A-site doping, for example by a higher-valent rare earth metal, can be compensated during the sintering process by inward diffusion of silver from the electrode layers. However, the precondition for this is that at the same time a stoichiometric excess of lead oxide is present. As an explanation for this, it is presumed that, during the sintering process, excess lead oxide produces liquid phases within the developing piezoceramic structure, which phases promote the inward diffusion of silver. It is furthermore surprising that the diffusion process of the silver is, so to speak, self-regulating. The driving force for the diffusion process is the heterovalent defect population of the A sites in the PZT crystal lattice, which are compensated by the monovalent silver. When a stoichiometric composition is reached, the driving force falls away, with the result that further inward diffusion of silver ceases. Furthermore, it is surprising about the process that, in spite of a maximum sintering temperature of, for example, 1130° C. for a 70/30 silver/palladium alloy, high grain sizes in the piezoceramic are obtained. It is presumed that the incorporation of the silver into the piezoceramic promotes the grain growth. In spite of a sintering temperature which. is reduced by 150 to 200° , just as high grain sizes and good piezoelectric values are achieved as in the case of a component sintered under optimum conditions and without electrodes, and for which correspondingly higher sintering temperatures can be selected. The achievement of an optimum density of at least 96 percent is also shifted to lower temperatures.

As a result of the excess of lead oxide set in piezoceramic powder, a further advantageous result is achieved. At the piezoceramic/electrode layer interface, a phase containing Pd-Pb-O forms as a result of inward diffusion of palladium, this phase being able to be detected in the interface region in grain boundary interstices following sintering. It is presumed that these phases are responsible for the improved adherence which has been established between the ceramic layers and electrode layers in the stack.

In an advantageous way, the sintering is carried out in an oxidizing atmosphere. Once the maximum sintering temperature has been reached, a holding phase of 30 to 120 minutes is maintained at this maximum temperature.

Both the lead excess and the excess A-site doping are preferably set to 1 to 3 mol percent independently of each other. A rare earth, preferably lanthanum or neodymium, is selected for the A-site doping.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which.

DESCRIPTION OF THE PREFERRED EMBODIMENTS

Figure 1:
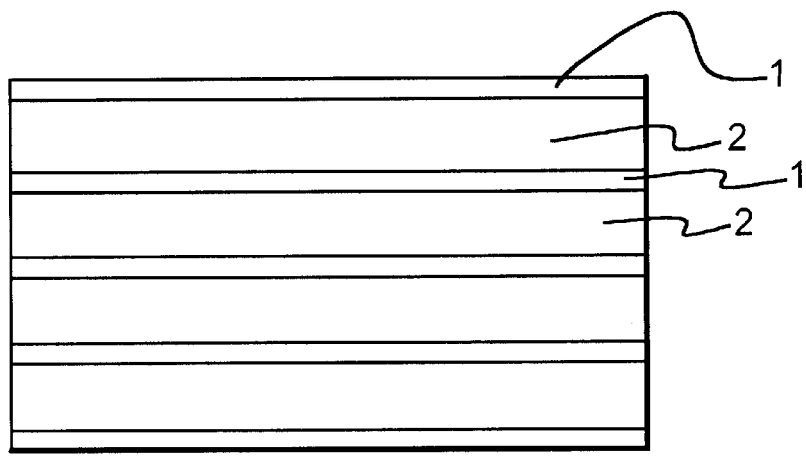
FIG. 1 shows a schematic cross-section through an alternating piezoceramic/electrode stack following sintering.

1. Production of a piezoelectric actuator from a piezoceramic having a high Curie temperature of 330° C.

A piezoceramic powder is prepared which has a nominal composition of $Pb_{0.98}$ $Nd_{0.02}$ $(Zr_{0.54}$ $Ti_{0.46})$ $O_{3.01}$. The starting materials, mixed as homogeneously as possible, can be produced in a accordance with known processes and be constituted, for example, in accordance with the mixed oxide process or via chemical routes, for example in accordance with the sol-gel process, the citrate process, the oxalate process or via other organometallic precursor compounds. Whereas for the mixed oxide process all the cations provided for the ceramic are mixed with one another in the form of their oxides and are then converted into PZT, other production processes start from mixed solutions of organometallic compounds of the desired cations. By means of precipitation from solution or by means of gradual thickening in the so-called solgel process, an extremely homogeneous distribution of the cations in the subsequent solid is achieved.

Following calcining, the product is re-ground, homogenized and then mixed with an organic binder. Green films are then drawn or cast using the slip obtained in this way. Following drying of the green films, these are provided with electrode material, for example printed with a paste which contains particles of a silver/ palladium alloy (70/30 mass ratio) in a binder with an overall printable consistency.

The piezoceramic green films are produced in a thickness which, taking into account linear shrinkage during the sintering of typically 15 percent, yields a piezoceramic thickness of 20 to 200 $\mu$m. For the electrode layer, sufficient electrode material is printed on to yield an electrode layer of about 2 to 3 $\mu$m thickness after the sintering. Given a small layer thickness ratio between the electrode layer and piezoceramic layer, correspondingly more electrode material must be printed on in order that the process of inward silver diffusion, leading to an electrode material loss, can be compensated. In this case the electrode layer can be printed on over the entire surface or in any desired but as fine as possible pattern.

The piezoceramic green films, printed with electrode material, are then stacked on one another, an alternating arrangement of piezoceramic layer and electrode layer resulting. By means of a laminating process under pressure and elevated temperature, the stack is precompressed and thereafter already exhibits sufficient coherence so that it can be handled as a stack. In this stage, it is also possible to divide a stack of relatively large base area, following lamination, into a plurality of identical stacks of smaller base area, for example by means of cutting or stamping. A plurality of such part-stacks can in turn be combined to form a larger stack. The total number of the layers which is required for the subsequent piezoelectric actuator depends on the level of deflection which is intended to be achieved using the piezoelectric actuator by means of applying a voltage. Since an individual piezoelectric element can be deflected typically by 1 to 2 parts per thousand of its thickness, the required number of individual layers for a desired total displacement can be quite simply calculated via the total layer thickness of the piezoceramic layers (following sintering). For example, for a desired application with a displacement of 20 $\mu$m, about 150 individual piezoceramic layers of about 100 $\mu$m thickness are sufficient.

Following the lamination of the stack or stacks, sintering takes place in an oxidizing atmosphere at 1130° C. This maximum temperature is maintained for about 1 hour and is then cooled down slowly.

FIG. 1: a piezoelectric actuator is obtained which has a high mechanical composite strength and therefore a high mechanical loadability. As can be shown by means of transverse sections through the stack, the electrode layers 1 are inherently largely coherent. A high degree of area coverage is thus achieved, which allows a homogeneous electric field when a voltage is applied. The piezoceramic layers 2 have high grain sizes of 2 $\mu$m to 10 $\mu$m. An analysis of the piezoceramic yields the following composition: $Pb_{0.96}$ $Ag_{0.02}$ $Nd_{0.02}$ $(Zr_{0.54}$ $Ti_{0.46})$ $O_3$. The composition is not only stoichiometric but also homogeneous over the entire piezoceramic layer. This can be verified, in particular, by a measurement of the silver concentration by means of microanalysis.

Figure 2:
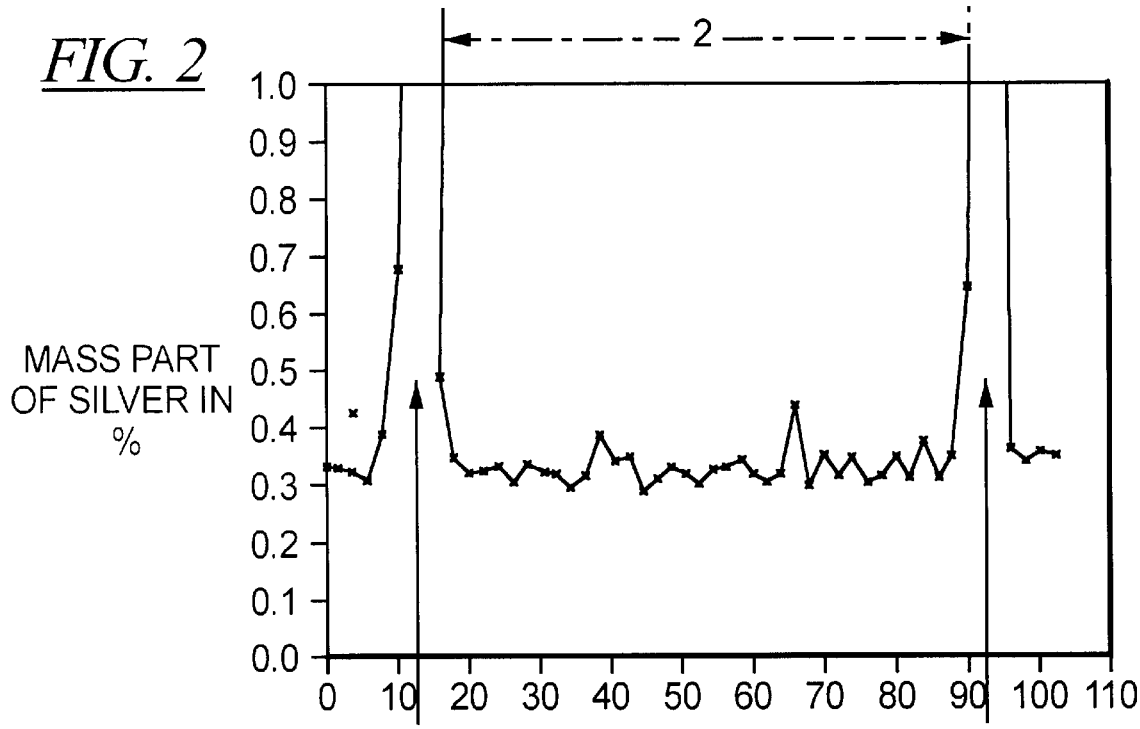
FIG. 2 shows a measured curve for the silver content of a piezoceramic layer in relation to the layer thickness following sintering.

FIG. 2 shows the profile of the silver content as a function of the distance from the piezoceramic layer/electrode layer interface. It can be seen that the silver concentration is extremely homogeneous over the entire layer thickness.

Figure 3:
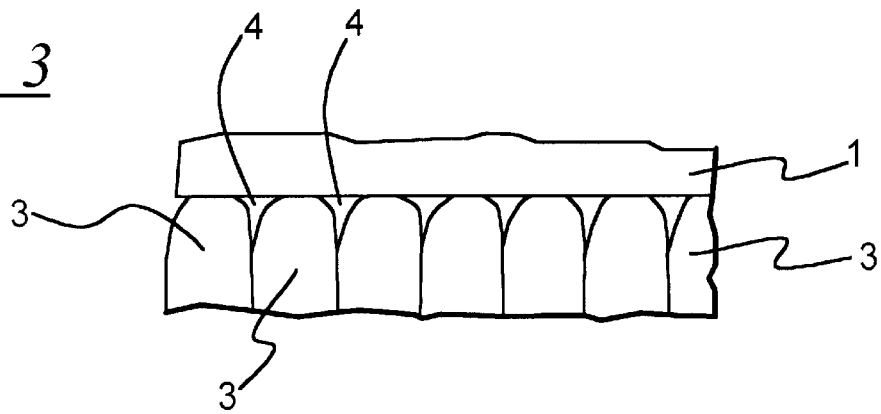
FIG. 3 shows in the form of a detail a region in the vicinity of the electrode layer/piezoceramic layer interface following sintering.

FIG. 3 shows, in an enlarged schematic cross-sectional representation, the electrode layer/piezoceramic layer interface area. The granulation 3 of the piezoceramic layer can be seen well. The grain boundary interstices 4 at the interface to the electrode layer 1, that is to say the interspaces geometrically predefined by the shape of the ceramic grains, exhibit a phase in which palladium, lead and oxygen can be detected. This phase can be detected up to a distance of 50 nm to a few $\mu$m from the interface to the electrode layer. It is assumed that, the electrode layer 1 interengages with the piezoceramic layer 2 with the aid of this phase and contributes to their increased strength according to the invention. Deeper within the piezoceramic layer or, for example, in the piezoceramic grains 3, no palladium can be detected.

The piezoelectric actuator of this composition is suitable for application temperatures up to about 150° C.

2. Production of a piezoceramic layer with low Curie temperature of 170° C.

A piezoceramic powder of the nominal composition $Pb_{0.99}$ $La_{0.01}$ $\{Zr_{0.30}$ $Ti_{0.36}$ $(Ni_{1/3}$ $Nb_{2/3})_{0.34}\}O_{3.005}$ is produced in accordance with known methods. Corresponding to the first exemplary embodiment, green films are prepared therefrom, provided with electrode material, layered to form the corresponding stacks, laminated and sintered under identical conditions. A piezoelectric actuator of high strength is obtained, for which a Curie temperature of 170° C. is determined. This actuator can therefore be used in a temperature range up to a maximum of about 80° C. The piezoceramic layers 2 have the following stoichiometric composition after the sintering: $Pb_{0.98}$ $Ag_{0.01}$ $La_{0.01}$ $\{Zr_{0.30}$ $Ti_{0.36}$ $(Ni_{1/3}$ $Nb_{2/3})_{0.34}\}O_3$.

This piezoceramic or, respectively, the piezoelectric actuator of multilayer design produced from it, possesses a complex doping for the B site, as can be seen from the formula. As a result, a piezoceramic with improved piezoelectric properties is obtained which exhibits in particular an increased relative deflection.

Added to these improvements in properties, known per se, as a property of the invention, is the fact that an improved strength in the composite of the piezoelectric actuator is also exhibited here. This ceramic composition is also stoichiometric following sintering, since the excess (La) doping is compensated during sintering by inward diffusion of silver, and excess lead oxide escapes by evaporating out of the ceramic. Here, too, a uniform silver content over the ceramic layer results, while palladium can once more only be detected in areas close to the interface in the form of the phases containing Pd-Pb-O in the grain boundary interstices 4 already mentioned in the case of the first exemplary embodiment.

With the invention it is possible to constitute a monolithic piezoelectric actuator of multilayer design which, by comparison with known piezoelectric actuators, exhibits an improved composite strength, can be produced with cost-effective electrode layers containing silver/ palladium, and, completely independent of any B-site doping which may be present, can also be sintered below an intrinsically optimum sintering temperature to form a high-quality ceramic having good piezoelectric properties. Therefore it is in particular possible to produce multilayer actuators having application temperatures up to 150° C., high mechanical loadability and high reliability, even in dynamic operation.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A process of providing a piezoelectric actuator of a monolithic multilayer design, comprising the steps of:

providing piezoceramic green films that are of a stoichiometric piezoceramic powder of a lead zirconium titanium type (PZT), said films having a stoichiometric excess of a heterovalent rare earth metal up to an overall content of 1 to 5 mol% and a stoichiometric excess of an additional 1 to 5 mol% of lead oxide;

applying electrode layers of a paste containing silver and palladium to the green films;

stacking the green films on one another to form a stack of films, laminating the stack of green films so that an alternating sequence of green films and electrode layers results in a laminated stack; and sintering the laminated stack under controlled sintering conditions of an oxidizing atmosphere at a maximum temperature of 1130° C. for a period of time in a range of 30 to 120 minutes so that excess lead oxide evaporates off, a the hyperstoichiometric rare earth doping is compensated by inward diffusion of silver from the electrode layers and stoichiometric piezoceramic layers with homogeneous silver doping are obtained.

2. The process according to claim 1, wherein the stoichiometric excess of lead oxide is 1 to 3 mol%.

3. The process according to claim 1, wherein, to obtain a predetermined thickness of 2–4 μm for the electrode layers after the step of sintering, the step of applying electrode layers includes determining a layer thickness ratio of the piezoceramic layers to the electrode layers and to a dopant content of the rare earth metal and then selecting a layer thickness allowance which compensates for subsequent layer thickness loss by the inward diffusion of the silver into the piezoceramic layers.

4. The process according to claim 1, wherein the rare earth metal is selected from a group consisting of lanthanum and neodymium.

5. The process according to claim 1, wherein the piezoceramic powder is a piezoceramic powder which has a complex B-site doping.

* * * * *